United States Patent
Ramgarajan et al.

(10) Patent No.: US 7,596,648 B2
(45) Date of Patent: Sep. 29, 2009

(54) SYSTEM AND METHOD FOR INFORMATION HANDLING SYSTEM ERROR RECOVERY

(75) Inventors: Madhusudhan Ramgarajan, Round Rock, TX (US); Vijay Nijhawan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 200 days.

(21) Appl. No.: 11/683,450

(22) Filed: Mar. 8, 2007

(65) Prior Publication Data

US 2008/0222449 A1    Sep. 11, 2008

(51) Int. Cl.
*G06F 13/24* (2006.01)
(52) U.S. Cl. .......................... 710/263; 710/268; 714/5; 714/13
(58) Field of Classification Search ......... 710/260–269; 714/5, 13
See application file for complete search history.

(56) References Cited

U.S. PATENT DOCUMENTS

| | | | |
|---|---|---|---|
| 6,178,550 B1 | 1/2001 | Pearce | 717/9 |
| 6,321,287 B1 | 11/2001 | Rao et al. | 710/260 |
| 6,564,276 B1 | 5/2003 | Tyner | 710/260 |
| 6,775,728 B2 * | 8/2004 | Zimmer et al. | 710/260 |
| 7,426,657 B2 * | 9/2008 | Zorek et al. | 714/13 |
| 7,447,934 B2 * | 11/2008 | Dasari et al. | 714/5 |
| 2006/0150009 A1 | 7/2006 | Takemori | 714/12 |
| 2006/0224808 A1 * | 10/2006 | Depew et al. | 710/267 |
| 2008/0052721 A1 * | 2/2008 | Rangarajan et al. | 718/105 |

* cited by examiner

*Primary Examiner*—Raymond N Phan
(74) *Attorney, Agent, or Firm*—Hamilton & Terrile, LLP; Robert W. Holland

(57) ABSTRACT

An information handling system recovers from memory errors associated with a memory unit that supports operation of an SMI handler by using another memory unit to support operation of the SMI handler. For example, if an SMI handler detects an error associated with a DIMM that supports operation of the SMI handler, then an SMI handler location module moves the SMI handler to another DIMM. For instance, a jump command is activated to jump to a pre-existing copy of the SMI handler stored at another DIMM. As another example, a relocation of the SMI handler to another DIMM is performed by changing address information used by the chipset and CPUs to run the SMI handler.

19 Claims, 4 Drawing Sheets

SYSTEM AND METHOD FOR INFORMATION HANDLING SYSTEM ERROR RECOVERY

BACKGROUND OF THE INVENTION

1. Field of the Invention

The present invention relates in general to the field of information handling system operations, and more particularly to a system and method for information handling system error recovery.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As information handling systems manage increasingly complex and critical functions, manufacturers have sought to improve system reliability in order to minimize disruptions that might result from system failures. A number of management subsystems monitor operating conditions of an information handling system to detect and correct errors before system failure occurs. One example of such a management subsystem is a System Management Interrupt (SMI) handler (SMI handler) running as firmware instructions on an information handling system, such as in the Basic Input/Output System (BIOS), to perform a variety of error handling functions related to memory. For example, an SMI handler running in BIOS on a server information handling system chipset typically maintains logs of correctable memory errors, uncorrectable memory errors, PCI and PCI-E errors and chipset errors. Typically, multiple correctable errors in a system are a precursor to uncorrectable errors, so the SMI handler uses logged errors to initiate error handling functions such as spare memory copy and memory RAID/mirroring. For example, spare memory copy, also known as sparing, switches to a spare rank of memory when a threshold number of correctable errors are detected. Sparing helps prevent uncorrectable errors that will hang the information handling system by relying on memory within the system that is not associated with logged errors.

One difficulty with error handling by SMI handlers is that code of the SMI handler typically relies on memory to perform error handling. For example, BIOS SMI code is typically located at a constant memory location within an information handling system from which memory management functions including error handling are performed. When correctable errors are detected within a memory DIMM where BIOS SMI code is located, the errors may become uncorrectable before the BIOS SMI handler can take appropriate corrective action, such as initiating sparing or mirroring. Once the errors become uncorrectable, the SMI handler may be unable to initiate RAS features correctly if SMI handler code stored in the memory becomes corrupt. Sparing to correct errors associated with SMI handler code will not prevent system failure if the sparing is not performed before errors become uncorrectable. Mirroring can recover from uncorrectable errors, however, mirroring typically needs hardware and chipset support and places a burden on the memory present in the system.

SUMMARY OF THE INVENTION

Therefore a need has arisen for a system and method which recovers an information handling system from memory errors related to memory management.

In accordance with the present invention, a system and method are provided which substantially reduce the disadvantages and problems associated with previous methods and systems for information handling system error recovery. Memory units supporting operation of an SMI handler are monitored to detect errors. Upon detection of predetermined errors associated with a memory unit that supports operation of an SMI handler, the SMI handler is moved to another memory unit.

More specifically, an information handling system having RAM with plural DIMMs runs an SMI error handler supported by memory of a DIMM. An SMI handler location module monitors errors detected with memory and, if an error is associated with the DIMM supporting operation of the SMI handler, moves the SMI handler to another DIMM. For example, during POST the SMI handler location module saves plural copies of the SMI handler on each of plural memory units, such as on each DIMM of an information handling system. Upon detection of a correctable error associated with a DIMM that is currently-supporting operation of the SMI handler, the SMI handler location module initiates memory management by an SMI handler stored on another DIMM. In one embodiment, a jump command is inserted in an active SMI handler to jump to another DIMM. In another embodiment, relocation of the SMI handler to another DIMM is accomplished by adjusting the SMI Base address and SMM TSEG area used by the CPU and chipset to run the SMI handler.

The present invention provides a number of important technical advantages. One example of an important technical advantage is that information handling system error recovery is supported for memory errors related to memory management. Upon detection of errors in memory units used to store an SMI handler, the SMI handler is automatically run from a different memory location. Storing multiple copies of the SMI handler in different memory unit locations, such as different DIMMs, at system POST ensures that an accurate copy of the SMI handler is available for error recovery. For SMI handlers, the use of an SMI relocation of the SMI Base address upon detection of an error in memory supporting the SMI handler allows error handling even where the SMI handler becomes corrupt.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Information handling system recovery from memory errors is enhanced by detecting that a memory error is associated with a memory unit supporting an SMI handler and by activating a copy of the SMI handler previously stored on another memory unit. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
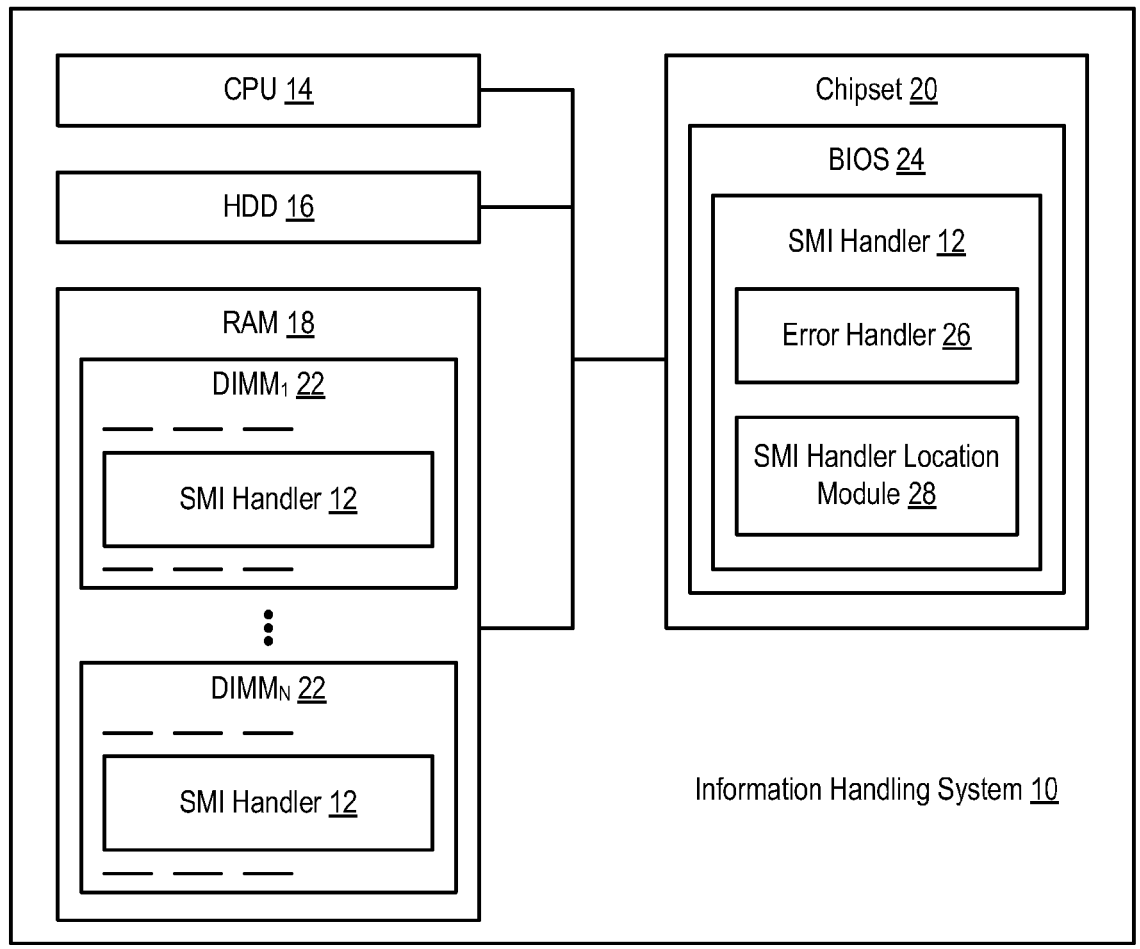
FIG. 1 depicts a block diagram of an information handling system having memory error recovery supporting movement of an SMI handler between memory units.

Referring now to FIG. 1, a block diagram depicts an information handling system 10 having memory error recovery supporting movement of an SMI handler between memory units. Information handling system 10 is built from a variety of processing components, such as one or more CPUs 14, a hard disk drive (HDD) 16, random access memory (RAM) 18 and a chipset 20. RAM 18 is broken into a plurality of units, such as plural dual in-line memory modules (DIMMs) 22. During startup of information handling system 10, such as during power-on self-test (POST), firmware instructions associated with chipset 20, such as a Basic Input/Output System (BIOS) 24, bring the processing components to an operational state. As part of the start-up, an SMI handler 12 is executed to manage interactions between CPU 14 and RAM 18. SMI handler 12 includes an SMI error handler 26 that performs error handling functions such as spare memory copy, correctable memory error logging, uncorrectable memory error logging, PCI/PCI-E error logging, Memory RAID/mirroring and chipset error logging. SMI handler 12 runs on chipset 20 supported by a copy stored on a DIMM 22 during start-up. Error handling functions may fail if the copy of SMI handler 12 in DIMM 22 becomes corrupt, such as due to an uncorrectable failure of the DIMM 22 that is supporting the operation of error handler 26.

In order to reduce the risk of a failure of information handling system 10 due to a failure of a DIMM 22 supporting operation of error handler 26, an SMI handler location module 28 detects such failures to move SMI handler 12 from a failed DIMM 22 to another DIMM 22 capable of supporting operation of error handler 26. During POST, SMI handler location module 28 creates a copy of SMI handler 12 in each of plural units of RAM 18, such as is plural DIMMs 22. SMI handler location module 28 marks SMI handler 12 as reserved in each memory unit to ensure that the SMI handler 12 are not inadvertently overwritten. For example, SMI handlers 12 are marked as reserved with an ACPI E820 code. Alternatively, SMI handlers 12 are marked as reserved by a hot-eject of the SMI memory with a follow-on hot-add having reserved status that prevents the operating system from using the memory. After information handling system 10 becomes operational, SMI handler location module 28 monitors errors logged by error handler 26 to detect errors associated with the DIMM 22 currently supporting operation of SMI handler 12. If a predetermined error state becomes associated with the DIMM 22 supporting operation of SMI handler 12, then SMI handler location module 28 initiates movement of support of SMI handler 12 from the current DIMM 22 to another DIMM 22 by initiating operation of SMI handler 12 at another DIMM 22. For example, a jump command is inserted in SMI handler 26 to jump to a stored copy of SMI handler 12 as set forth in FIG. 3. As another example, SMI handler 12 is relocated with the support of chipset 20 as set forth in FIG. 4.

Figure 2:
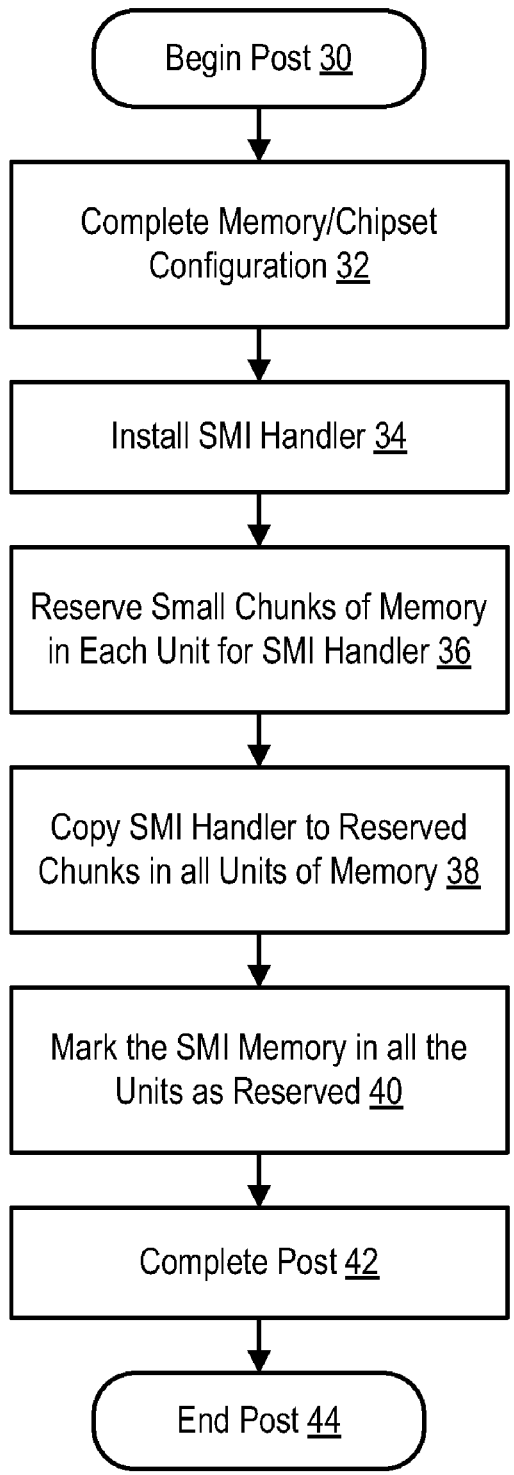
FIG. 2 depicts a flow diagram of a process for storing plural copies of an SMI handler in each of plural memory units.

Referring now to FIG. 2, a flow diagram depicts a process for storing plural copies of an SMI handler in each of plural memory units. The process begins at step 30 with start-up of the information handling system and POST. At step 32, memory and chipset configuration is completed in the POST process and, at step 34, the SMI handler is installed to manage memory functions. At step 36, small chunks of memory, such as approximately a 64 k chunk in each DIMM of memory or other defined unit, are reserved to store a copy of the SMI handler. At step 38, a copy of the SMI handler is made at each reserved chunk of memory in each memory unit. At step 40, the location of each copy of the SMI handler in each memory unit is marked as reserved to preclude subsequent overwriting of any of the copies of the SMI handler. At step 42, POST is completed and, at step 44, the process for storing plural copies of the SMI handler on plural memory units ends with the end of POST.

Figure 3:
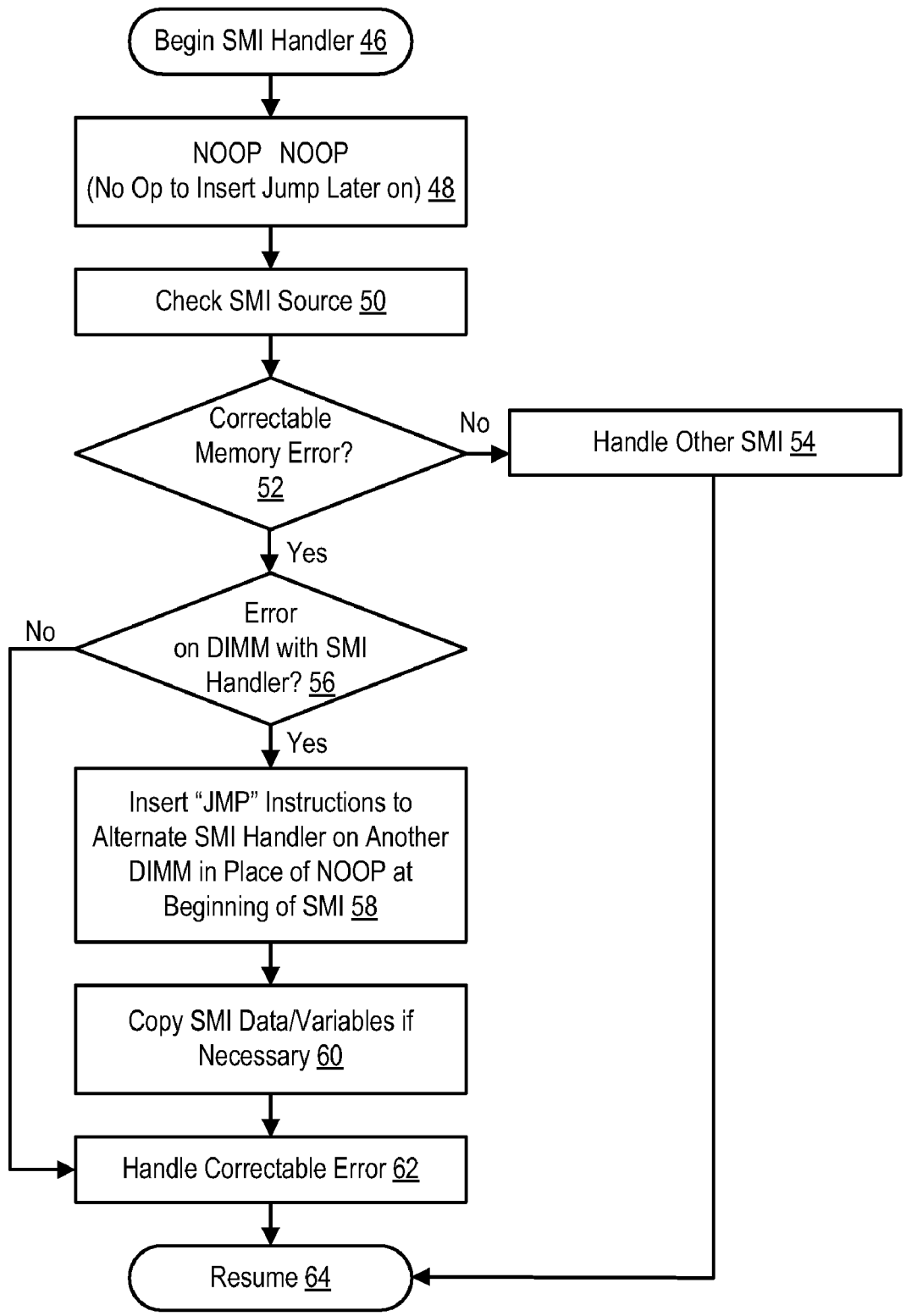
FIG. 3 depicts a flow diagram of a process for jumping to a stored SMI handler if an error is detected with a memory unit supporting an operating SMI handler.

Referring now to FIG. 3, a flow diagram depicts a process for jumping to a stored SMI handler if an error is detected with a memory unit supporting an operating SMI handler. The process begins at step 46 with initiation of the SMI handler to perform error handling functions. At step 48, a NOOP or "no operation" instruction is inserted. If an error is detected with the DIMM supporting operation of the SMI handler, insertion of a jump command at step 50 followed by initiation of the SMI handler at step 46 will jump the SMI handler to operate from a different DIMM. At step 50 a check of the SMI source is performed. At step 52, a determination is made of whether a detected memory error is correctable. If not, the process continues to step 54 to handle the uncorrectable error. If the determination at step 52 is that the error is correctable, the process continues to step 56 to determine if the error is associated with the DIMM supporting the SMI handler. If yes, the process continues to step 58 to insert a jump command in the place of the NOOP command of step 48. The jump command jumps to an alternate SMI handler at another DIMM so that, at the next initiation of the SMI handler, the SMI handler will move from the DIMM having the error to a copy at another DIMM not associated with an error. At step 60, SMI data and variables are copied if needed for the execution of the jump command. At step 62, the correctable error is handled by the SMI handler and, at step 64, the process resumes. If at step 56, the error is not associated with the DIMM that supports operation of the SMI handler, the process continues to step 62 to handle the error without inserting the jump command.

Figure 4:
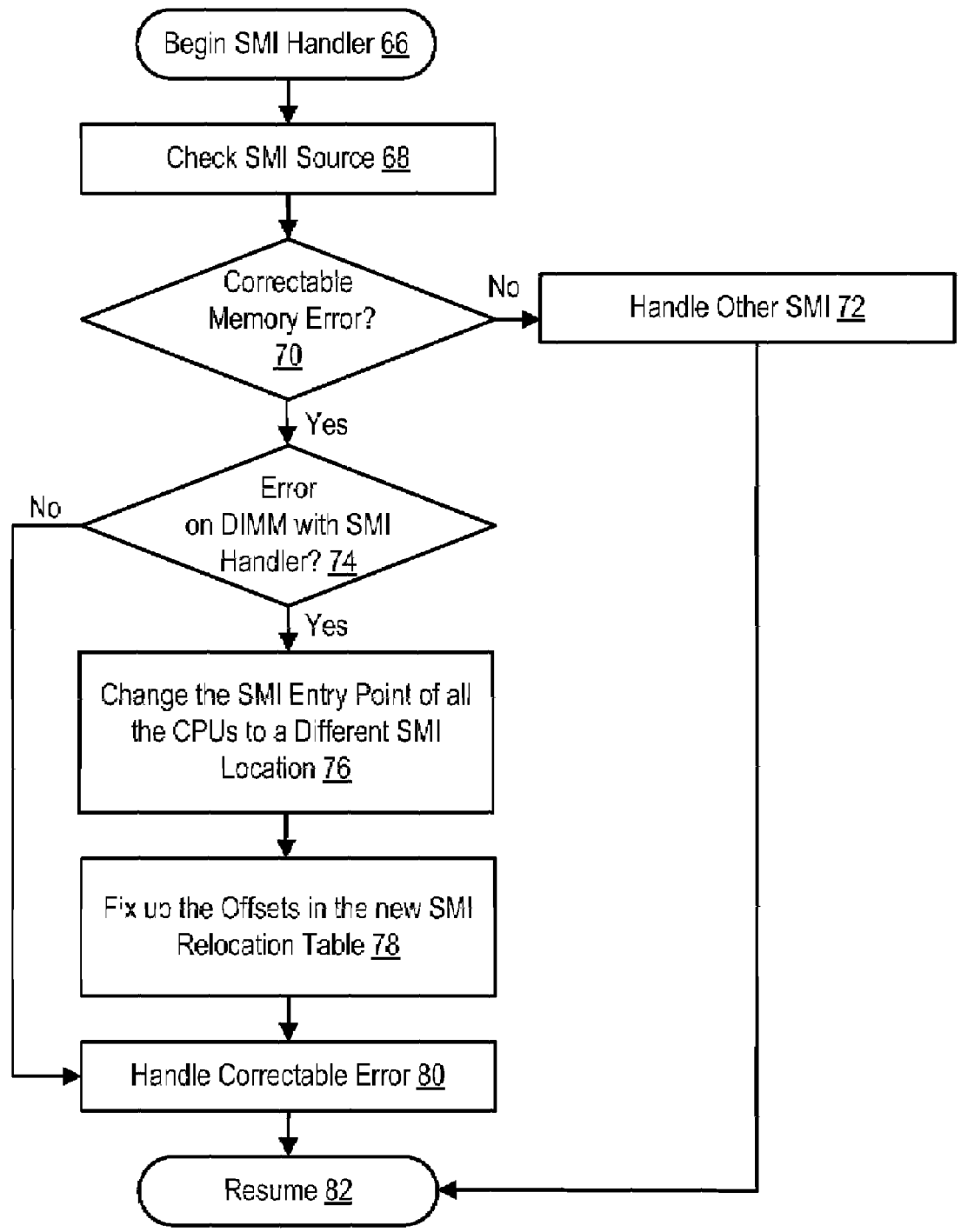
FIG. 4 depicts a flow diagram of a process for relocation of an SMI handler from a DIMM associated with a detected error to another DIMM.

Referring now to FIG. 4, a flow diagram depicts a process for relocation of an SMI handler from a DIMM associated with a detected error to another DIMM. The process begins with initiation of the SMI handler at step 66 and continues to step 68 to check the SMI source. At step 70 a determination is made of whether a detected error is correctable. If not, the process continues to step 72 to handle the uncorrectable error and ends with resumping of the SMI error handler at step 82. If a determination is made at step 70 that a detected error is correctable, the process continues to step 74 to determine if the error is at the DIMM associated with support of operation of the SMI handler. If yes, at step 76, the SMI entry point for all CPUs of the information handling system is changed to a different SMI location at a different DIMM. For example, the BIOS changes the SMBASE address of all CPUs to match a new SMM TSEG area in another DIMM. At step 78, the offsets in the new SMI relocation table are fixed to ensure that SMM calls and jumps arrive at the correct location. For example, the BIOS patches relocation table offsets in the new SMM TSEG area so that all the calls and jumps in the new SMM area goes to correct locations. At step 80, the correctable error is handled. If at step 74 a determination is made that the error is with a DIMM other than the DIMM supporting operation of the SMI handler, the process continues to step 80 to handle the correctable error.

Moving an SMI handler from a DIMM when a correctable error occurs reduces the risk that the SMI handler will be operating from the DIMM during an uncorrectable error. If the correctable error is corrected and does not reoccur according to a predefined standard, then the SMI handler can be returned to the original DIMM if desired. Use of the jump command as set forth by FIG. 3 reduces the risk of an uncorrectable error resulting in unpredictable error-logging behavior, however, use of the jump command may not handle a catastrophic corruption of the SMI handler that leads to failure of execution of initial SMI handler instructions that jump to a different location. Relocation of BIOS SMI Base address information to an address located in a different DIMM provides a more robust solution that provides movement of the SMI handler in the event of catastrophic failures, however, will also likely require chipset support of SMI relocation.

Although the present invention has been described in detail, it should be understood that various changes, substitutions and alterations can be made hereto without departing from the spirit and scope of the invention as defined by the appended claims.

What is claimed is:

1. An information handling system comprising:
   a CPU operable to process information;
   RAM interfaced with the CPU and operable to store information, the RAM having plural units;
   an SMI handler running in association with a first unit of the RAM and operable to perform error handling associated with the RAM; and
   an SMI handler location module associated with the SMI handler, the SMI handler location module operable to store plural copies of the SMI handler in plural RAM units, to monitor the first unit of RAM for errors, and to run the SMI handler in association with one of the plural copies if an error is detected at the first unit of the RAM.

2. The information handling system of claim 1 further comprising a chipset operable to run firmware, the SMI handler and SMI handler location module comprising firmware operable to run on the chipset.

3. The information handling system of claim 1 wherein the RAM units comprise RAM DIMMs.

4. The information handling system of claim 1 wherein SMI handler location module comprises a jump command inserted into the SMI handler upon detection of the error at the first unit of the RAM, the jump command jumping the SMI handler to the one of the plural copies of the SMI handler if an error is detected at the first unit of the RAM.

5. The information handling system of claim 1 wherein the SMI handler comprises an address of the first unit of RAM, the SMI handler location module comprising instructions to change the SMI handler address from the first unit of RAM to an address of the one of the plural copies of the SMI handler if an error is detected at the first unit of the RAM.

6. The information handling system of claim 5 wherein the SMI handler address comprises an SMBASE address.

7. The information handling system of claim 5 wherein the SMI handler address comprises an SMM ISEG area.

8. The information handling system of claim 1 wherein the SMI handler location module stores the plural copies of the SMI handler in the plural RAM units at POST of the information handling system.

9. The information handling system of claim 8 wherein the SMI handler location module is further operable to mark each copy of the SMI handler as reserved.

10. A method for recovery of an information handling system from a memory error, the method comprising:
    storing plural copies of an SMI handler in RAM of the information handling system, each copy stored in a RAM unit;
    executing the SMI handler from a first of the plural copies stored in a first of RAM unit;
    detecting an error associated with the RAM unit from which the first of the plural copies is executing; and
    in response to detecting the error, executing the SMI handler from a second of the plural copies in a second RAM unit.

11. The method of claim 10 wherein a RAM unit comprises a DIMM.

12. The method of claim 10 further comprising:
    detecting resolution of the error associated with the RAM unit from which the first of the plural copies is executing; and
    in response to detecting resolution of the error, executing the SMI handler from the first of the plural copies in the first RAM unit.

13. The method of claim 10 wherein storing plural copies of an SMI handler comprises storing a copy of the SMI handler in each of plural RAM DIMMs during POST of the information handling system.

14. The method of claim 13 further comprising marking each copy of the SMI handler as reserved.

15. The method of claim 10 wherein in response to detecting the error, executing the SMI handler from a second of the plural copies in a second RAM unit further comprises:
    inserting a jump command at the start of the SMI handler, the jump command jumping to the second of the plural copies in the second RAM unit; and
    executing the SMI handler to initiate the jump command.

16. The method of claim 10 wherein in response to detecting the error, executing the SMI handler from a second of the plural copies in a second RAM unit further comprises:
    changing an address for SMI handler associated with the CPU from the first of the plural copies to the second of the plural copies.

17. A system for recovery of an information handling system from a memory error, the system comprising:
    an SMI handler operable to perform error handling associated with memory errors, the error handling including detection of memory errors and association of detected memory errors with a memory unit; and
    an SMI handler location module associated with the SMI handler and operable to determine that a detected memory error is associated with a memory unit supporting operation of the SMI handler, the SMI handler location module responding to the detected memory error by initiating a copy of the SMI handler stored in another memory unit to replace the SMI handler associated with the detected error.

18. The system of claim 17 wherein SMI handler location module comprises instructions to:
- store a copy of the SMI handler in plural memory units at startup of an information handling system; and
- jump to a copy of the SMI handler in response to a memory error detected at a memory unit supporting operation of the SMI handler.

19. The system of claim 17 wherein the SMI handler location module comprises instructions to:
- store a copy of the SMI handler in plural memory units at startup of an information handling system; and
- change the SMBASE address of all CPUs of the information handling system to match the SMM ISEG area of a copy of the SMI handler in another memory unit.

* * * * *